United States Patent
Jung

(10) Patent No.: US 7,439,774 B2
(45) Date of Patent: Oct. 21, 2008

(54) MULTIPLEXING CIRCUIT FOR DECREASING OUTPUT DELAY TIME OF OUTPUT SIGNAL

(75) Inventor: Ho Don Jung, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/637,167

(22) Filed: Dec. 12, 2006

(65) Prior Publication Data

US 2007/0290716 A1    Dec. 20, 2007

(30) Foreign Application Priority Data

Jun. 15, 2006    (KR) .................. 10-2006-0053956

(51) Int. Cl.
*H03K 19/20*    (2006.01)
*H03K 19/094*    (2006.01)

(52) U.S. Cl. ...................... 326/113; 326/37; 326/47

(58) Field of Classification Search ............. 326/37, 326/113; 327/407–408
See application file for complete search history.

(56) References Cited

U.S. PATENT DOCUMENTS 5,625,303 A * 4/1997 Jamshidi ................. 326/113
6,031,401 A   2/2000 Dasgupta
7,138,833 B2 * 11/2006 Tanaka .................... 326/113

FOREIGN PATENT DOCUMENTS

JP    08/111632    4/1996
KR    1020050113000    12/2005

OTHER PUBLICATIONS

Rhyne, Fundamentals of Digitals Systems Design, 1933, N.J., pp. 70-71.*

* cited by examiner

*Primary Examiner*—Anh Q Tran
(74) *Attorney, Agent, or Firm*—Lowe Hauptman Ham & Berner, LLP

(57) ABSTRACT

Disclosed herein is a multiplexing circuit for decreasing the output delay time of an output signal. The multiplexing circuit includes multiplexing units and a multiplexing output unit. Each multiplexing unit is initialized in response to an initialization signal, and outputs an input signal as a selection output signal in response to a selection control signal. The multiplexing output unit performs a logic operation on selection output signals received from the multiplexing units and outputs a multiplexing output signal based on the results of this operation. Preferably, the initialization signal is shared by two of the multiplexing units, and the initialization signal which is input to one of the two multiplexing units is the selection control signal which in input to the other of the two multiplexing units.

25 Claims, 7 Drawing Sheets

MULTIPLEXING CIRCUIT FOR DECREASING OUTPUT DELAY TIME OF OUTPUT SIGNAL

BACKGROUND OF THE INVENTION

The present invention relates generally to a semiconductor device and, more particularly, to a multiplexing circuit.

Generally, a multiplexing circuit selects one of a plurality of signals and outputs the selected signal, or successively and separately outputs the plurality of signals to a single output terminal at set time intervals. As described above, the multiplexing circuit is mainly used as a circuit for selectively outputting specific input signals.

FIG. 1 is a diagram schematically illustrating a conventional multiplexing circuit. Referring to FIG. 1, the multiplexing circuit 10 includes a selection circuit 11, an output circuit 12 and an initialization circuit 13. The operation of the multiplexing circuit 10 is briefly described below with reference to FIG. 2. First, the initialization circuit 13 initializes the voltage level of the output node OUT of the selection circuit 11 to a predetermined voltage in response to a power-up signal PWRUP. Thereafter, when selection control signals SEL1~SELN (N is integer) are sequentially enabled, input signals SCLK1~SCLKN (N is integer) are sequentially and separately output to the output node OUT as the selection output signal SO. The output circuit 12 outputs a multiplexing output signal OUTEN in response to the selection output signal SO received via the output node OUT.

Meanwhile, the load of the selection circuit 11 increases as the number of the input signals, which are input to the selection circuit 11, increases. The reason for this is that when the number of input signals of the selection circuit 11 increases, the selection circuit 11 must further include circuits for selecting the additional input signals. When the load of the selection circuit 11 increases, a point at which the selection circuit 11 outputs the selection output signal SO to the output node OUT is delayed. For example, when the input signals SCLK1~SCLK3 and SCLK6~SCLKN are logic low, and the input signals SCLK4 and SCLK5 are logic high, it is preferred that the selection output signal SO become logic high when the selection control signal SEL4 is enabled, and, thereafter, become logic high when the selection control signal SEL5 is disabled.

However, due to the load of the selection circuit 11, as illustrated in FIG. 2, the selection output signal SO is delayed for time T from a point, at which the selection control signal SEL4 is enabled, and then becomes logic high. As a result, the point at which the multiplexing circuit 10 outputs the multiplexing output signal OUTEN is delayed. As described above, when the output time point for the multiplexing circuit 10 is delayed, a circuit (not shown) for performing a specific operation in response to the output signal of the multiplexing circuit 10 may operate erroneously.

SUMMARY OF THE INVENTION

Accordingly, the present invention has been made keeping in mind the above problems occurring in the prior art, and an object of the present invention is to provide a multiplexing circuit which decreases a load using a separate multiplexing structure, thereby decreasing the output delay time of an output signal.

In order to accomplish the above object, the present invention provides a multiplexing circuit including a plurality of multiplexing units and a multiplexing output unit. Each of the multiplexing units is initialized in response to an initialization signal, and outputs an input signal as a selection output signal in response to a selection control signal. The multiplexing output unit performs a logic operation on a plurality of selection output signals received from the plurality of multiplexing units and outputs a multiplexing output signal based on the results of the operation. Preferably, the initialization signal is shared by two of the plurality of multiplexing units, and the initialization signal which is input to one of the two multiplexing units is the selection control signal which in input to the other of the two multiplexing units.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
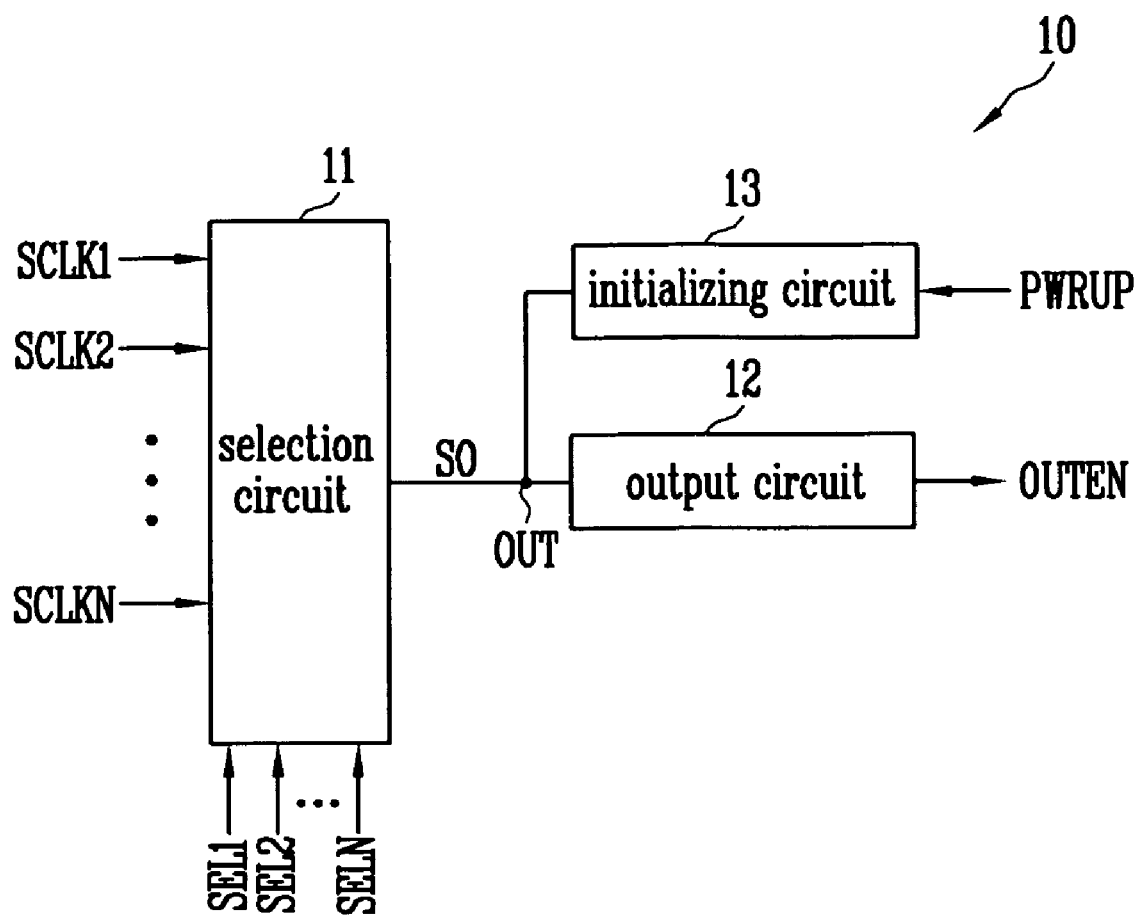
FIG. 1 is a diagram schematically illustrating a conventional multiplexing circuit.
Figure 2:
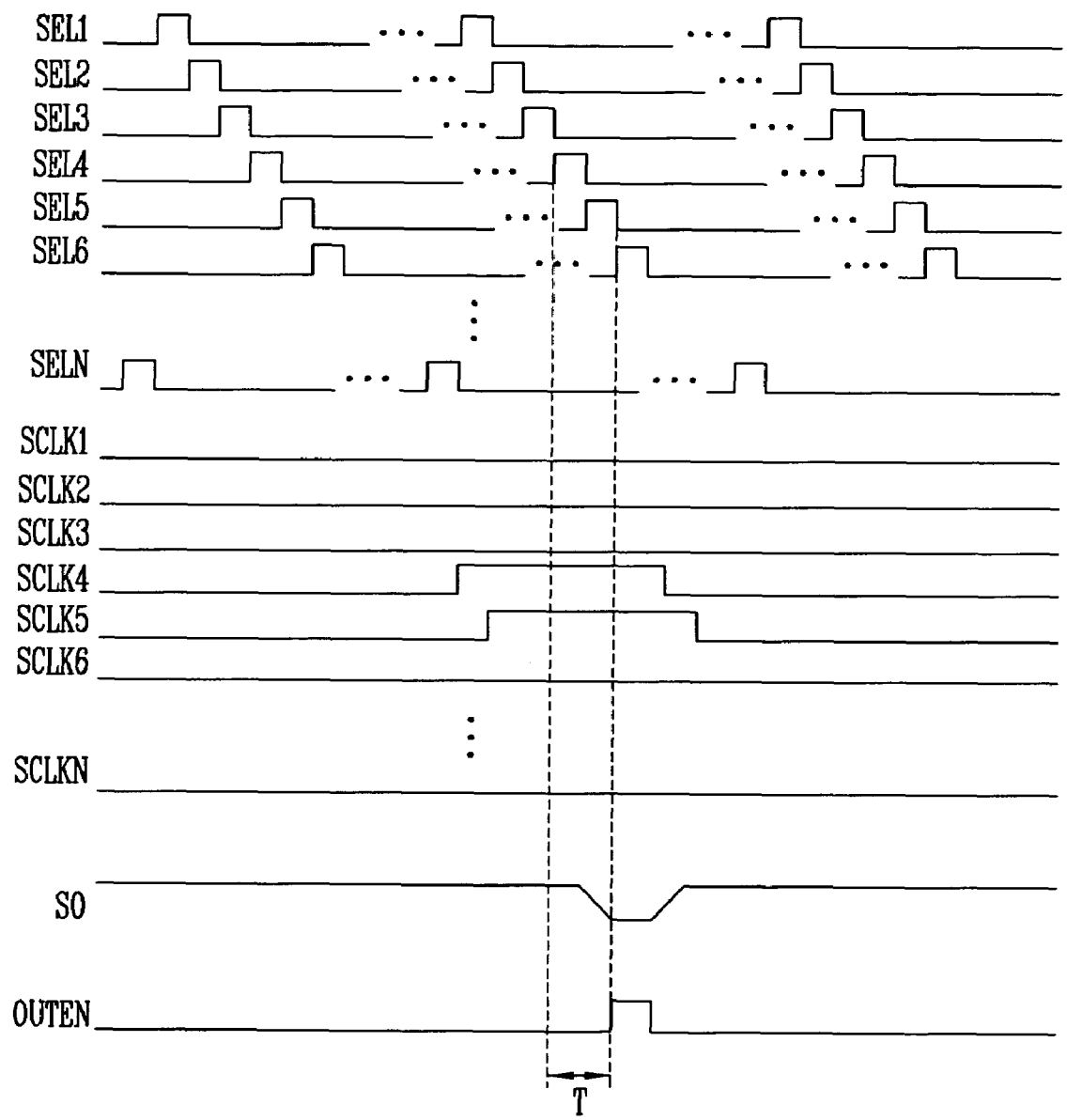
FIG. 2 is a timing diagram of signals related to the operation of the multiplexing circuit illustrated in FIG. 1.

Reference now should be made to the drawings, in which the same reference numerals are used throughout the different drawings to designate the same or similar components.

Preferred embodiments of the present invention are described below with reference to the accompanying drawings.

Figure 3:
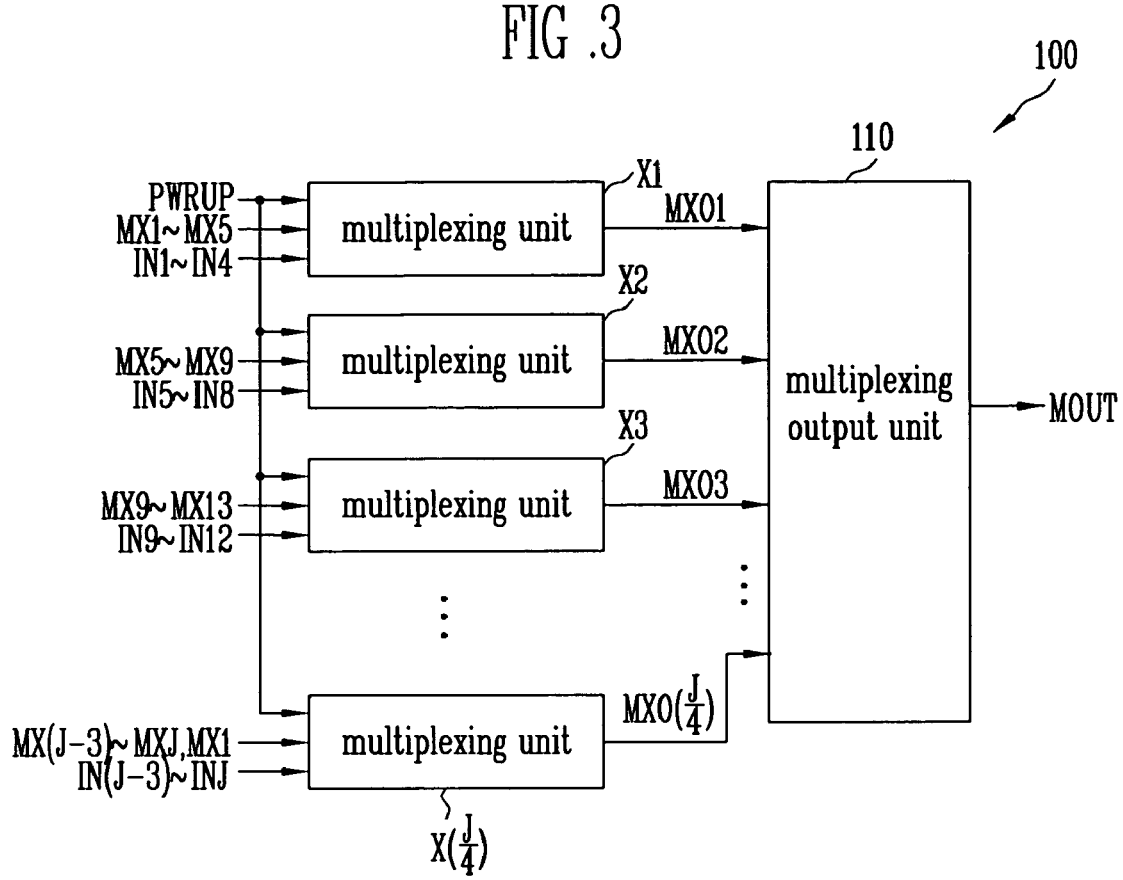
FIG. 3 is a block diagram illustrating a multiplexing circuit according to an embodiment of the present invention.

FIG. 3 is a block diagram illustrating a multiplexing circuit according to an embodiment of the present invention.

The multiplexing circuit 100 includes a plurality of multiplexing units X1~X(J/4)(J is an integer representing the number of bits input to the multiplexing circuit 100) and a multiplexing output unit 110. The multiplexing units X1~X(J/4) are initialized in response to a power-up signal PWRUP and selection control signals (that is, initialization signals) MX5, MX9, MX13, . . . , MX1 respectively. When a power supply voltage, applied to a semiconductor device including the multiplexing circuit 100, becomes a set voltage, the power-up signal PWRUP becomes logic high for a set time, and is then maintained at logic low.

For example, the multiplexing unit X1 is initialized in response to the power-up signal PWRUP and the selection control signal MX5, and the multiplexing unit X(J/4) is initialized in response to the power-up signal PWRUP and the selection control signal MX1. Each of the multiplexing units X1~X(J/4) selects one of four input signals in response to one of four selection control signals, and outputs the selected signal as a selection output signal.

In more detail, the multiplexing unit X1 selects one of the input signals IN1~IN4 in response to the selection control signals MX1~MX4 and outputs the selected output signal as a selection output signal MXO1. The multiplexing unit X1 is initialized in response to the selection control signal MX5 and the power-up signal PWRUP. The multiplexing unit X2 selects one of the input signals IN5~IN8 in response to the selection control signals MX5~MX8 and outputs the selected signal as the selection output signal MXO2. The multiplexing unit X2 is initialized in response to the selection control signal MX9 and the power-up signal PWRUP. Meanwhile, the multiplexing unit X(J/4) selects one of the input signals IN(J-3)~INJ in response to selection control signals MX(J-3)~MXJ, and outputs the selected signal as a selection output signal MXO(J/4). The multiplexing unit X(J/4) is initialized in response to the selection control signal MX1 and the power-up signal PWRUP.

As described above, each of the multiplexing units X1~X(J/4) receives the selection control signal of its neighboring multiplexing unit as an initialization signal. That is, the multiplexing unit X1 receives the selection control signal MX5, which is input to the multiplexing unit X2, as the initialization signal, and the multiplexing unit X2 receives the selection control signal MX9, which is input to the multiplexing unit X3, as the initialization signal.

Preferably, when one of the multiplexing units X1~X(J/4) outputs one of the selection output signals MXO1~MXO(J/4), the remaining multiplexing units stop an output operation. Furthermore, the multiplexing unit X(J/4) receives the selection control signal MX1 which is input to the multiplexing unit X1 as an initialization signal. The multiplexing output unit 110 performs a logic operation on the selection output signals MXO1~MXO(J/4) respectively received from the multiplexing units X1~X(J/4), and outputs the multiplexing output signal MOUT according to the results of the operation.

In FIG. 3, the situation in which four input signals are input to each of the multiplexing units X1~X(J/4) will now be described as an example, but the number of input signals which are input to each of the multiplexing units X1~X(J/4) may increase or decrease depending on the need. In this case, the number of selection control signals which are input to each of the multiplexing units X1~X(J/4) may be determined depending on the number of input signals which are input to each of the multiplexing units X1~X(J/4). Furthermore, the selection control signals which respectively initialize the multiplexing units X1~X(J/4) may be changed depending on the number of input signals which are input to each of the multiplexing units X1~X(J/4).

For example, when the number of input signals which are input to each of the multiplexing units X1~X(J/4) is 7, the multiplexing unit X1 selects one of the input signals IN1~IN7 in response to the selection control signals MX1~MX7, and is initialized in response to the selection control signal MX8 and the power-up signal PWRUP. Furthermore, the multiplexing unit X2 selects one of the input signals IN8~IN14 in response to the selection control signals MX8~MX14, and is initialized in response to the selection control signal MX15 and the power-up signal PWRUP.

Figure 4:
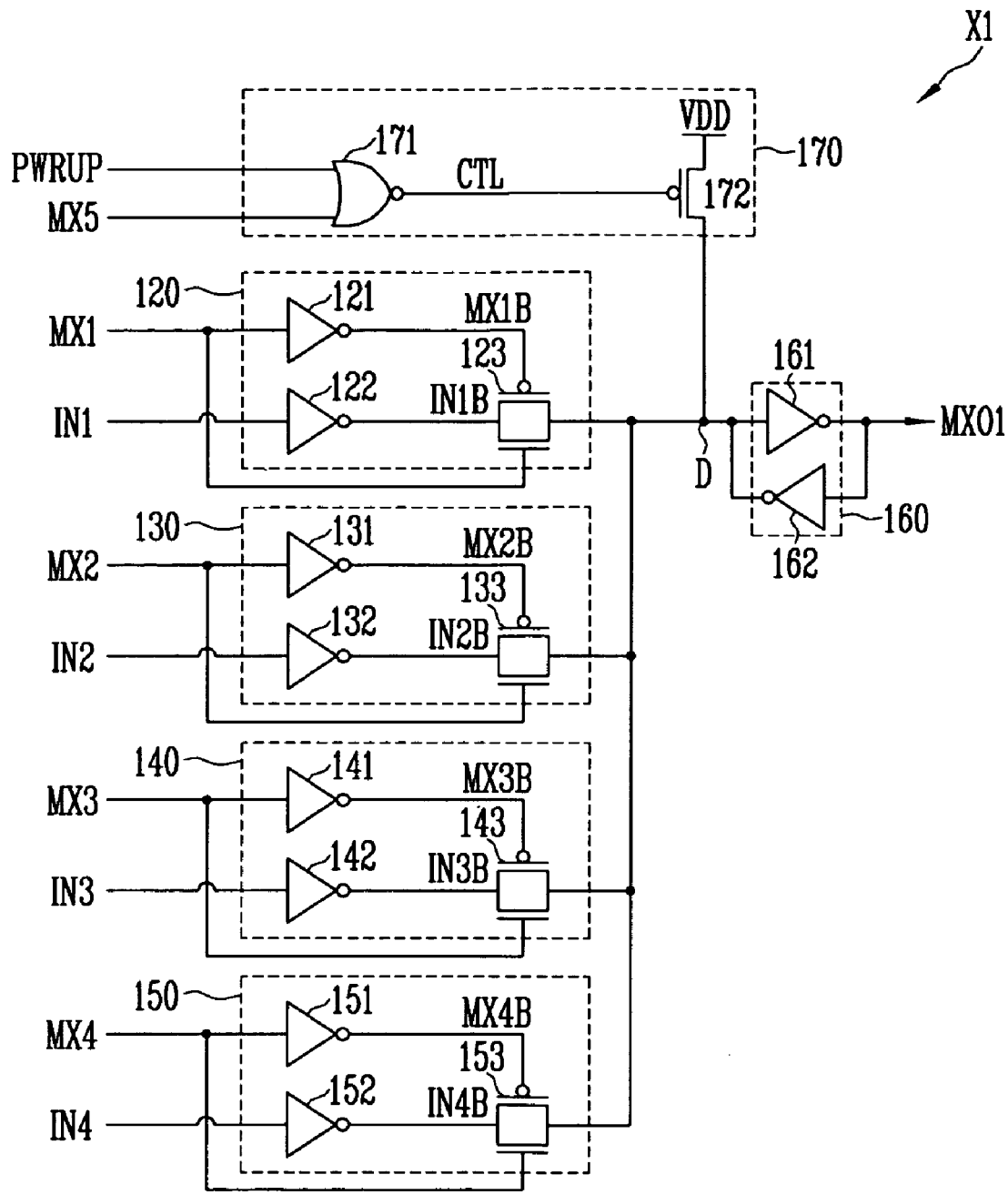
FIG. 4 is a diagram illustrating the detail circuit of a multiplexing unit illustrated in FIG. 3.

FIG. 4 is a diagram illustrating the detail circuit of a multiplexing unit illustrated in FIG. 3. The constructions and operations of the multiplexing units X1~X(J/4) are similar to each other, so that the construction and operation of the multiplexing units X1 are described with reference to FIG. 4.

The multiplexing unit X1 includes selection circuits 120, 130, 140 and 150, a latch circuit 160, and an initialization circuit 170. The selection circuits 120, 130, 140 and 150 are connected parallel to an output node D.

The construction and detail operations of the selection circuits 120, 130, 140 and 150 are similar to each other. The selection circuits 120, 130, 140 and 150 include inverters 121 and 122, 131 and 132, 141 and 142, and 151 and 152, and switch circuits 123, 133, 143, and 153, respectively. Preferably, the switch circuits 123, 133, 143, and 153 are implemented as a transfer gate. Hereinafter, each of the switch circuits 123, 133, 143, and 153 is considered as a transfer gate. The selection circuit 120 includes the inverters 121 and 122 and the transfer gate 123. The inverter 121 inverts the selection control signal MX1, and outputs the inverted selection control signal MX1B. The inverter 122 inverts the input signal IN1, and outputs the inverted input signal IN1B. The inverted input signal IN1B is input to the first terminal of the transfer gate 123, and the second terminal of the transfer gate 123 is connected to the output node D. The transfer gate 123 is turned on or turned off in response to the selection control signal MX1 and the inverted selection control signal MX1B. Preferably, when the selection control signal MX1 becomes logic high, the transfer gate 123 is turned on. The selection circuit 130 includes inverters 131 and 132 and a transfer gate 133. Then inverter 131 inverts the selection control signal MX2 and outputs the inverted selection control signal MX2B. The inverter 132 inverts the input signal IN2, and outputs the inverted input signal IN2B. The inverted input signal IN2B is input to the first terminal of the transfer gate 133, and the second terminal of the transfer gate 133 is connected to the output node D. The transfer gate 133 is turned on or turned off in response to the selection control signal IN2 and the inverted selection control signal MX2B. Preferably, when the selection control signal MX2 becomes logic high, the transfer gate 133 is turned on. The selection circuit 140 includes inverters 141 and 142 and a transfer gate 143. Then inverter 141 inverts the selection control signal MX3 and outputs the inverted selection control signal MX3B. The inverter 142 inverts the input signal IN3, and outputs the inverted input signal IN3B. The inverted input signal IN3B is input to the first terminal of the transfer gate 143, and the second terminal of the transfer gate 143 is connected to the output node D. The transfer gate 143 is turned on or turned off in response to the selection control signal MX3 and the inverted selection control signal MX3B. Preferably, when the selection control signal MX3 becomes logic high, the transfer gate 143 is turned on. The selection circuit 150 includes inverters 151 and 152 and a transfer gate 153. Then inverter 151 inverts the selection control signal MX4 and outputs the inverted selection control signal MX4B. The inverter 152 inverts the input signal IN4, and outputs the inverted input signal IN4B. The inverted input signal IN4B is input to the first terminal of the transfer gate 153, and the second terminal of the transfer gate 153 is connected to the output node D. The transfer gate 153 is turned on or turned off in response to the selection control signal MX4 and the inverted selection control signal MX4B. Preferably, when the selection control signal MX4 becomes logic high, the transfer gate 153 is turned on. Furthermore, when one of the selection control signals MX1~MX4 becomes logic high, the remaining selection control signals become logic low. Therefore, when one of the selection circuits 120~150 inverts one of the input signals IN1~IN4 and outputs it to the output node D, the remaining selection circuits do not operate. Selectively, each of the selection circuits 120, 130, 140 and 150 includes only one inverter and a transfer gate. In this case, the input signals IN1, IN2, IN3 and IN4 are input to the first terminals of the transfer gates 123, 133, 143, and 153, respectively.

The latch circuit 160 latches one of the inverted input signals IN1B~IN4B received via the output node D, and outputs the latched signal as a selection output signal MXO1. The construction and detail operation of the latch circuit 160 can be understood by those skilled in the art, thereby being omitted. The initialization circuit 170 initializes the latch circuit 160 by supplying a set voltage (for example, internal voltage VDD) to the output node D in response to the selection control signal MX5 (that is, initialization signal) and the power-up signal PWRUP. The initialization circuit 170 includes a NOR gate 171 and a switch circuit 172. Preferably, the switch circuit 172 is implemented using a PMOS transistor. The NOR gate 171 outputs a control signal CTL in response to the initialization signal MX5 and the power-up signal PWRUP. Preferably, when the initialization signal MX5 and the power-up signal PWRUP are both logic low, the NOR gate 171 outputs the control signal CTL at a logic high level. Furthermore, when any one of the initialization signal MX5 and the power-up signal PWRUP becomes logic high, the NOR gate, 171 outputs the control signal CTL at a logic low level. The switch circuit 172 is turned off when the control signal CTL become logic high. The switch circuit 172 is turned on when the control signal CTL becomes logic low, and then applies the internal voltage VDD to the output node D. As a result, the latch circuit 160 is initialized and thus outputs the selection output signal MXO1 at a logic low level.

Although, in FIG. 4, the case in which each of the multiplexing units X1~X(J/4) includes four selection circuits is described as an example, the number of selection circuits included in each of the multiplexing units X1~X(J/4) may increase or decrease depending on the number of input signals which are input to each of the multiplexing units X1~X(J/4).

That is, as long as the output delay time of one of the inverted input signals IN1B~IN4B which is output to the output node D is within a predetermined range, the number of transfer gates, which are connected parallel to the output node D, may increase or decrease depending on the number of input signals.

Since each of the multiplexing units X1~X(J/4) includes a limited number of selection circuits, the load thereof can decrease. For example, comparing with a multiplexing circuit, the output node of which is connected to 30 selection circuits, each of the multiplexing units X1~X(J/4) includes four selection circuits, so that the load thereon can further decrease. As a result, the output delay time of each of the multiplexing units X1~X(J/4) can decrease.

Figure 5:
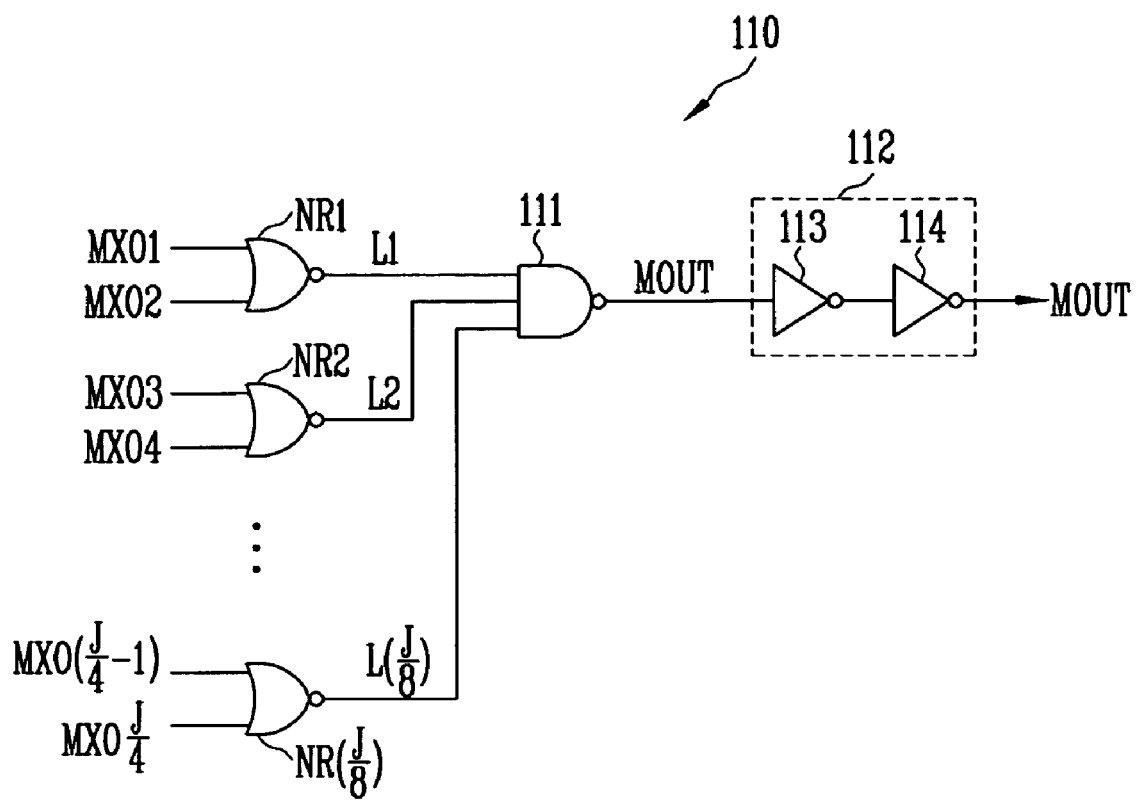
FIG. 5 is a diagram illustrating a multiplexing output unit illustrated in FIG. 3 in detail.

FIG. 5 is a diagram illustrating the multiplexing output unit 110 illustrated in FIG. 3 in detail.

The multiplexing output unit 110 includes NOR gates NR1~NR(J/8), a NAND gate 111 and a buffer 112. Each of the NOR gates NR1~NR(J/8) performs a logic operation on two selection output signals. For example, the NOR gate NR1 outputs a logic signal L1 in response to selection output signals MXO1 and MXO2. The NOR gate NR2 outputs a logic signal L2 in response to selection output signals MXO3 and MXO4. The NOR gate NR(J/8) outputs a logic signal L(J/8) in response to the selection output signals MXO(J/4−1) and MXO(J/4). The NAND gate 111 outputs a multiplexing output signal MOUT in response to logic signals L1~L(J/8). The buffer 112 includes inverters 113 and 114 connected serial to the output terminal of the NAND gate 111. The buffer 112 buffers and then outputs the multiplexing output signal MOUT.

Figure 7:
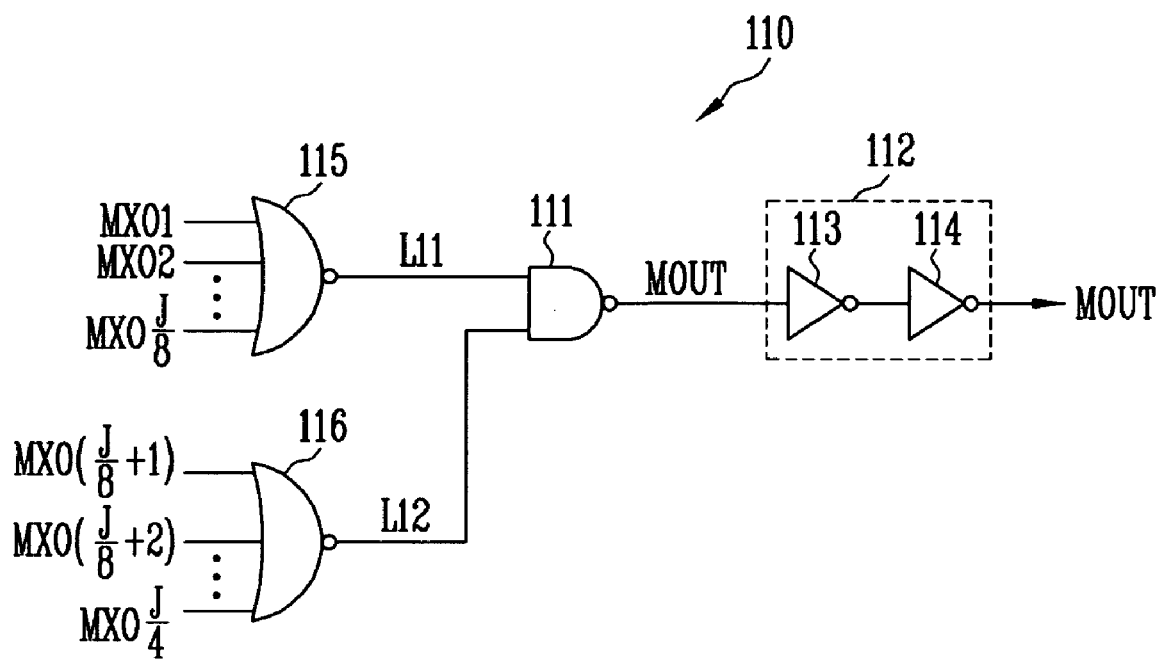
FIG. 7 is a diagram illustrating a multiplexing output illustrated in FIG. 3 in detail according to an embodiment of the present invention.

Although, in FIG. 5, the case in which the multiplexing output unit 110 includes the NOR gates NR1~NR(J/8) is shown as an example, alternatively, the multiplexing output unit 110 includes two NOR gates as illustrated in FIG. 7. Referring to FIG. 7, the multiplexing output 110 includes NOR gates 115 and 116, n NAND gate 111 and a buffer 112. The NOR gate 115 output a logic signal L11 in response to the selection output signals MXO1~MXO(J/8). The NOR gate 116 output a logic signal L12 in response to the selection output signals MX(J/8+1)~MXO(J/4). The NAND gate 111 outputs the multiplexing output signal MOUT in response to the logic signals L11 and L12.

Figure 6:
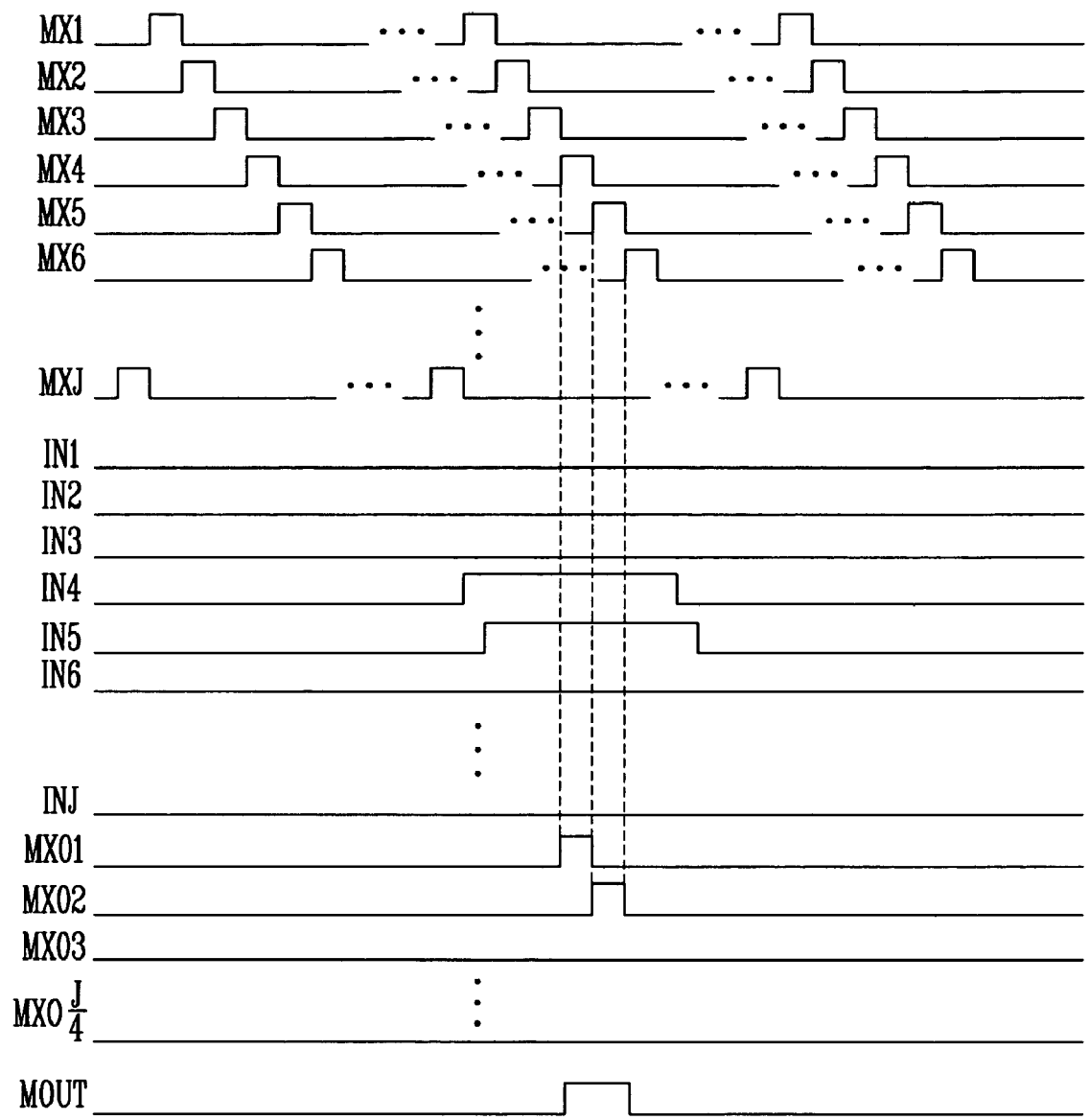
FIG. 6 is a timing diagram of signals related to the operation of the multiplexing circuit illustrated in FIG. 3.

Hereinafter, the operation of the multiplexing circuit 100 is described in detail with reference to FIG. 6.

Here, the operation of the multiplexing circuit 100 in the case in which four input signals are input to each multiplexing unit X1~X(J/4) is described for convenience. FIG. 6 is a timing diagram of signals related to the operation of the multiplexing circuit illustrated in FIG. 3. As illustrated in FIG. 6, selection control signals MX1~MXJ sequentially and separately become logic high for predetermined time. When the selection control signals MX1~MX3 and MX6~MXJ respectively become logic high, input signals IN1~IN3 and IN6~INJ are maintained to be logic low. Furthermore, when the selection control signals MX4 and MX5 respectively become logic high, the input signals IN4 and IN5 become logic high. When the selection control signal MX1 becomes logic high, the selection circuit 120 of the multiplexing unit X1 inverts the input signal IN1 in response to the selection control signal MX1, and then outputs the inverted input signal IN1B to an output node D. The latch circuit 160 of the multiplexing unit X1 latches the inverted input signal IN1B and outputs a selection output signal MXO1. If the input signal IN1 is logic low, the latch circuit 160 outputs the selection output signal MXO1 at a logic low level. Thereafter, when the selection control signal MX2 becomes logic high, the selection circuit 130 of the multiplexing unit X1 inverts the input signal IN2 and output the inverted input signal IN2B to the output node D in response to the selection control signal MX2. The latch circuit 160 latches the inverted input signal IN2B and outputs the selection output signal MXO1. Since the input signal IN2 is logic low, the latch circuit 160 outputs the selection output signal MXO1 at a logic low level. When the selection control signal MX3 becomes logic high, the selection circuit 140 of the multiplexing circuit X1 inverts the input signal IN3 in response to the selection control signal MX3 and outputs the inverted input signal IN3B to the output node D. The latch circuit 160 latches the inverted input signal IN3B and outputs the selection output signal MXO1. Since the input signal IN3 is logic low, the latch circuit 160 outputs the selection output signal MXO1 at a logic low level. When the selection control signal MX4 becomes logic high, the selection circuit 150 of the multiplexing circuit X1 inverts the input signal IN4 in response to the selection control signal MX4 and outputs the inverted input signal IN4B to the output node D. The latch circuit 160 latches the inverted input signal IN4B and outputs the selection output signal MXO1. Since the input signal IN4 is logic high, the latch circuit 160 outputs the selection output signal MXO1 at a logic high level. Thereafter, when the selection control signal MX5 becomes logic high, the initialization circuit 170 of the multiplexing unit X1 supplies the internal voltage VDD to the output node D. As a result, the latch circuit 160 of the multiplexing unit X1 is initialized and outputs the selection output signal MXO1 at a logic low level. Meanwhile, when the selection control signal MX5 becomes logic high, the selection circuit of the multiplexing unit X2 (not shown) inverts the input signal IN5 in response to the selection control signal MX5 and outputs the inverted input signal IN5B (not shown) to the output node D of the multiplexing unit X2 (not shown). The latch circuit of the multiplexing unit X2 (not shown) latches the inverted input signal IN5B, and outputs the selection output signal MXO2. Since the input signal IN5 is logic high, the latch circuit of the multiplexing unit X2 outputs the selection output signal MXO2 at a logic high level. Thereafter, the multiplexing units X2~X(J/4) operate similarly to the multiplexing unit X1, and thus respectively output the selection output signals MXO2~MXO(J/4). Since the input signals are maintained at logic low, and the input signals IN4 and IN5 are maintained to be logic high, the multiplexing unit X1 outputs the selection output signal MXO1 at a logic high level while the selection control signal MX4 is logic high.

Furthermore, the multiplexing unit X2 outputs the selection output signal MXO2 at a logic high level while the selection control signal MX5 is logic high. The multiplexing output unit 110 outputs the logic signal L1 at a logic low level while the selection output signals MXO1 and MXO2 are logic high. Since the selection output signals MXO3~MXO(J/4) are maintained to be logic low, the NOR gates NR2~NR(J/8) output the logic signals L2~L(J/8) at a logic high level. The NAND gate 111 of the multiplexing output unit 110 outputs the multiplexing output signal MOUT at a logic high level while the logic signal L1 is logic low. The buffer 112 of the multiplexing output unit 110 buffers and outputs the multiplexing output signal MOUT.

As described above, since the multiplexing circuit 100 includes a plurality of multiplexing units having separate multiplexing structures, the load on the multiplexing units decrease, thereby decreasing the output delay time of the multiplexing output signal.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A multiplexing circuit, comprising:
 a plurality of multiplexing units, each of the plurality of multiplexing units receiving a input signal, an initialization signal, and a selection control signal and outputting a selection output signal, each of the multiplexing units comprising:
   a selection circuit connected to an output node for outputting the input signal to an output node in response to the selection control signal:
   a latch circuit for latching the input signal received via the output node and outputting the latched signal as the selection output signal: and
   an initialization circuit for initializing the output selection signal in response to the initialization signal; and
 a multiplexing output unit for performing a logic operation on the selection output signals received from each of the plurality of multiplexing units,
 wherein each of the plurality of multiplexing units is initialized in response to the initialization signal and outputs the input signal as the selection output signal in response to the selection control signal; and
 the initialization signal is shared by two of the plurality of multiplexing units, and the initialization signal which is input to one of the two multiplexing units is the selection control signal to be input to the other of the two multiplexing units.

2. The multiplexing circuit as set forth in claim 1, wherein each of the multiplexing units further comprises at least one additional selection circuit connected to the output node parallel to the selection circuit and configured to output an additional input signal to the output node.

3. The multiplexing circuit as set forth in claim 2, wherein a number of the selection circuits included in each of the plurality of multiplexing units are determined depending on a number of the input signals input to each of the plurality of multiplexing units.

4. The multiplexing circuit as set forth in claim 2, wherein the selection circuit comprises:
 an inverter for inverting the selection control signal and outputting an inverted selection control signal; and
 a switch circuit having a first terminal to which the input signal is input, and a second terminal which is connected to the output node, and configured to be turned on or off in response to the selection control signal and the inverted selection control signal.

5. The multiplexing circuit as set forth in claim 4, wherein the selection circuit further comprises an additional inverter for inverting the input signal and outputting the inverted input signal to the first terminal; and
 the switch circuit outputs the inverted input signal received via the first terminal to the output node when turned on.

6. The multiplexing circuit as set forth in claim 4, wherein the switch circuit is a transfer gate.

7. The multiplexing circuit as set forth in claim 1, wherein a set voltage is an internal voltage and the initialization circuit comprises:
 a NOR gate for output a control signal in response to the initialization signal;
 a switch circuit having a first terminal to which the internal voltage is input, and a second terminal which is connected to the output node, and wherein the switch circuit is configured to be turned on or off in response to the control signal.

8. The multiplexing circuit as set forth in claim 7, wherein the switch circuit is a PMOS transistor.

9. The multiplexing circuit as set forth in claim 1, wherein the multiplexing output unit comprises:
 a plurality of NOR gates; and
 a NAND gate for outputting a multiplexing output signal in response to a plurality of logic signals received from the plurality of NOR gates; and
 wherein each of the plurality of NOR gates outputs one of the plurality of logic signals in response to some of the plurality of selection output signals; and
 each selection output signal is inputted to exactly one of the NOR gates.

10. The multiplexing circuit as set forth in claim 1, wherein the multiplexing output unit comprises:
 a first NOR gate for outputting a first logic signal in response to some of the plurality of selection output signals;
 a second NOR gate for outputting a second logic signal in response to the remaining selection output signals; and
 a NAND gate for outputting the multiplexing output signal in response to the first and second logic signals.

11. The multiplexing circuit as set forth in claim 1, wherein, when one of the plurality multiplexing units outputs the selection output signal, remaining multiplexing units do not operate; and
 each of the plurality multiplexing units outputs the selection output signal and is then initialized in response to the initialization signal.

12. A multiplexing circuit, comprising:
 first multiplexing unit for outputting a first input signal to an output node as a first selection output signal in response to a first selection control signal;
 second multiplexing unit for outputting a second input signal to the output node as a second selection output signal in response to a second selection control signal; and
 a latch circuit for latching the input signal received via the output node and outputting the latched signal as the selection output signal, wherein the first multiplexing unit is initialized in response to the second selection control signal and the second multiplexing unit is initialized in response to the first selection control signal.

13. The multiplexing circuit as set forth in claim 12, wherein each of the multiplexing units comprises:
a selection circuit for outputting the input signal to the output node in response to the selection signal; and
an initialization circuit for initializing the output node.

14. The multiplexing circuit as set forth in claim 13, wherein the selection circuit comprises:
an inverter for inverting the selection control signal and outputting an inverted selection control signal; and
a switch circuit having a first terminal to which the input signal is input, and a second terminal which is connected to the output node, and configured to be turned on or off in response to the selection control signal and the inverted selection control signal.

15. The multiplexing circuit as set forth in claim 13, wherein the initialization circuit comprises:
a NOR gate for output a control signal in response to the initialization signal;
a switch circuit having a first terminal to which the internal voltage is input, and a second terminal which is connected to the output node, and wherein the switch circuit is configured to be turned on or off in response to the control signal.

16. A multiplexing circuit, comprising:
a plurality of multiplexing units, each of the plurality of multiplexing units being configured to latch an input signal and to output the input signal to one of a plurality of first output terminals which corresponds to the corresponding multiplexing unit, in response to a selection control signal;
a multiplexing output unit for logically combining output signals from the plurality of first output terminals and for outputting a logically combined signal to a second output terminal; and
a plurality of initialization circuits, each corresponding to one of the plurality of multiplexing units, wherein each one of the plurality of initialization circuits is configured to initialize a corresponding multiplexing unit in response to a power up-signal and the selection control signal which is inputted to a subsequent neighboring multiplexing unit.

17. The multiplexing circuit as set forth in claim 16, wherein each of the multiplexing units comprises:
a selection circuit connected to an output node for outputting the input signal to the output node in response to the selection control signal; and
a latch circuit for latching the input signal received via the output node and outputting the latched signal as the selection output signal to the first output terminal.

18. The multiplexing circuit as set forth in claim 17, wherein each of the multiplexing units further comprises at least one additional selection circuit connected to the output node parallel to the selection circuit and configured to output an additional input signal to the output node.

19. The multiplexing circuit as set forth in claim 18, wherein a number of the selection circuits included in each of the plurality of multiplexing units are determined depending on a number of the input signals input to each of the plurality of multiplexing units.

20. The multiplexing circuit as set forth in claim 18, wherein the selection circuit comprises:
an inverter for inverting the selection control signal and outputting an inverted selection control signal; and
a switch circuit having a first terminal to which the input signal is input, and a second terminal which is connected to the output node, and configured to be turned on or off in response to the selection control signal and the inverted selection control signal.

21. The multiplexing circuit as set forth in claim 20, wherein the switch circuit is a transfer gate.

22. The multiplexing circuit as set forth in claim 16, wherein each of the initialization circuits comprises:
a NOR gate for outputting a control signal in response to the power up signal and one of the selection signals which are inputted to a subsequent neighboring multiplexing unit; and
a switch circuit having a first terminal to which an internal voltage is input, and a second terminal which is connected to the output node, and wherein the switch circuit is configured to be turned on or off in response to the control signal.

23. The multiplexing circuit as set forth in claim 22, wherein the switch circuit is a PMOS transistor.

24. The multiplexing circuit as set forth in claim 16, wherein the multiplexing output unit comprises:
a plurality of NOR gates; and
a NAND gate for outputting a multiplexing output signal in response to a plurality of logic signals received from the plurality of NOR gates; and
wherein each of the plurality of NOR gates outputs one of the plurality of logic signals in response to some of the plurality of selection output signals; and
each selection output signal is inputted to exactly one of the NOR gates.

25. The multiplexing circuit as set forth in claim 16, wherein the multiplexing output unit comprises:
a first NOR gate for outputting a first logic signal in response to some of the plurality of selection output signals;
a second NOR gate for outputting a second logic signal in response to the remaining selection output signals; and
a NAND gate for outputting the multiplexing output signal in response to the first and second logic signals.

* * * * *